US010670223B2

(12) United States Patent
Suzuki et al.

(10) Patent No.: US 10,670,223 B2
(45) Date of Patent: Jun. 2, 2020

(54) LIGHT EMITTING MODULE

(71) Applicant: NICHIA CORPORATION, Anan-shi (JP)

(72) Inventors: Takuya Suzuki, Naruto (JP); Takashi Mukai, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/390,000

(22) Filed: Apr. 22, 2019

(65) Prior Publication Data

US 2019/0323678 A1 Oct. 24, 2019

(30) Foreign Application Priority Data

Apr. 24, 2018 (JP) ................................ 2018-082776

(51) Int. Cl.

| | |
|---|---|
| ***F21S 45/70*** | (2018.01) |
| ***F21S 41/176*** | (2018.01) |
| ***F21S 41/16*** | (2018.01) |
| ***F21V 23/00*** | (2015.01) |
| ***F21V 23/04*** | (2006.01) |

(52) U.S. Cl.

CPC ............... *F21S 45/70* (2018.01); *F21S 41/16* (2018.01); *F21S 41/176* (2018.01); *F21V 23/004* (2013.01); *F21V 23/0457* (2013.01)

(58) Field of Classification Search

CPC .......... F21S 45/70; F21S 41/16; F21S 41/176; F21V 23/004; F21V 23/0457

See application file for complete search history.

(56) References Cited

U.S. PATENT DOCUMENTS

| | | | | |
|---|---|---|---|---|
| 10,389,439 | B2 * | 8/2019 | Richter .............. | H04B 10/5057 |
| 2014/0009952 | A1 | 1/2014 | Nomura et al. | |
| 2015/0085262 | A1 | 3/2015 | Ogura | |

FOREIGN PATENT DOCUMENTS

| | | |
|---|---|---|
| JP | 64-059878 | 3/1989 |
| JP | 7-193540 | 7/1995 |
| JP | 4946737 B2 | 3/2009 |
| JP | 2012-222322 | 11/2012 |
| JP | 6091926 B2 | 9/2014 |
| JP | 2015-060159 | 3/2015 |
| JP | 2015-168305 | 9/2015 |
| JP | 2016-092288 | 5/2016 |
| WO | WO 2012/124522 | 9/2012 |

* cited by examiner

*Primary Examiner* — Thomas M Sember

(74) *Attorney, Agent, or Firm* — Mori & Ward, LLP

(57) ABSTRACT

A light emitting module includes a laser element and a first transistor including a first electrode connected to the laser element, a second electrode connected to a power supply, and a control electrode. A second transistor includes a first electrode connected to a second reference potential via a first resistor, a second electrode connected to a first reference potential, and a control electrode. The control electrode of the first transistor is connected to the first electrode of the second transistor and the first resistor. A conversion member is to convert a laser beam emitted by the laser element and includes a sensing wire via which the control electrode of the second transistor is connected to a third reference potential. The control electrode of the second transistor is connected to a fourth reference potential via a second resistor.

18 Claims, 7 Drawing Sheets

LIGHT EMITTING MODULE

CROSS-REFERENCE TO RELATED APPLICATION

This application claims priority to Japanese Patent Application No. 2018-082776, filed on Apr. 24, 2018, the disclosure of which is hereby incorporated by reference in its entirety.

BACKGROUND

The embodiments of the present disclosure relate to light emitting modules.

Light emitting modules employing laser diodes (LDs) and used as lighting equipment and automotive headlights have been developed. In such a light emitting module, the laser beam from an LD irradiates a conversion member by which the wavelength is converted, and is externally emitted as light suited for lighting.

In such a light emitting module, if the conversion member is damaged by an external shock or the like, there is a possibility that the laser beam leaks from the light emitting module and enter the human eye. For this reason, there has been a proposal for turning off the LD in the event of a damaged conversion member (for example, see Japanese Patent Publication No. 6091926 and Japanese Unexamined Patent Application Publication No. 2015-060159).

SUMMARY

According to one aspect of the present invention, a light emitting module includes a laser element, a first transistor, a second transistor, and a conversion member. The laser element is to emit a laser beam. The first transistor includes a first electrode connected to the laser element, a second electrode connected to a power supply, and a control electrode. The second transistor includes a first electrode connected to a second reference potential via a first resistor, a second electrode connected to a first reference potential, and a control electrode. The control electrode of the first transistor is connected to the first electrode of the second transistor and the first resistor. The conversion member is to convert the laser beam emitted by the laser element into light having a wavelength different from a wavelength of the laser beam. The conversion member includes a sensing wire via which the control electrode of the second transistor is connected to a third reference potential. The control electrode of the second transistor is connected to a fourth reference potential via a second resistor. The first transistor is configured to be turned on when the first reference potential is applied to the control electrode of the first transistor. The first transistor is configured to be turned off when the second reference potential is applied to the control electrode of the first transistor. The second transistor is configured to be turned on when the third reference potential is applied to the control electrode of the second transistor. The second transistor is configured to be turned off when the fourth reference potential is applied to the control electrode of the second transistor.

According to another aspect of the present invention, a light emitting module includes a laser element, a first n-channel transistor, a second n-channel transistor, and a conversion member. The laser element is to emit a laser beam. The first n-channel transistor includes a drain, a source, and a gate. One of the source and the drain is connected to the laser element. Another of the source or the drain is connected to a power supply. The second n-channel type second transistor includes a drain, a source, and a gate. The drain is connected to a sensing potential. The source is connected to a common potential lower than the sensing potential via a first resistor. The gate of the first transistor is connected to the source of the second n-channel transistor and the first resistor. The conversion member is to convert the laser beam into a light having a wavelength different from a wavelength of the laser beam. The conversion member includes a sensing wire via which the gate of the second transistor is connected to the sensing potential. The gate of the second transistor is connected to the common potential via a second resistor. The first transistor is configured to be turned on when the first reference potential is applied to the control electrode of the first transistor. The first transistor is configured to be turned off when the second reference potential is applied to the control electrode of the first transistor. The second transistor is configured to be turned on when the third reference potential is applied to the control electrode of the second transistor. The second transistor is configured to be turned off when the fourth reference potential is applied to the control electrode of the second transistor.

According to further aspect of the present invention, a light emitting module includes a laser element, a conversion member, a first transistor, a second transistor, a first resistor, a sensing wire, and a second resistor. The laser element is to emit a laser beam. The conversion member is to convert the laser beam into a light having a different wavelength from a wavelength of the laser beam. The first transistor is serially connected to the laser element. The first resistor is serially connected to the second transistor at a first connection node that is connected to a control node of the first transistor. The sensing wire is provided on the conversion member. The second resistor serially connected to the sensing wire at a second connection node that is connected to a control electrode of the second transistor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
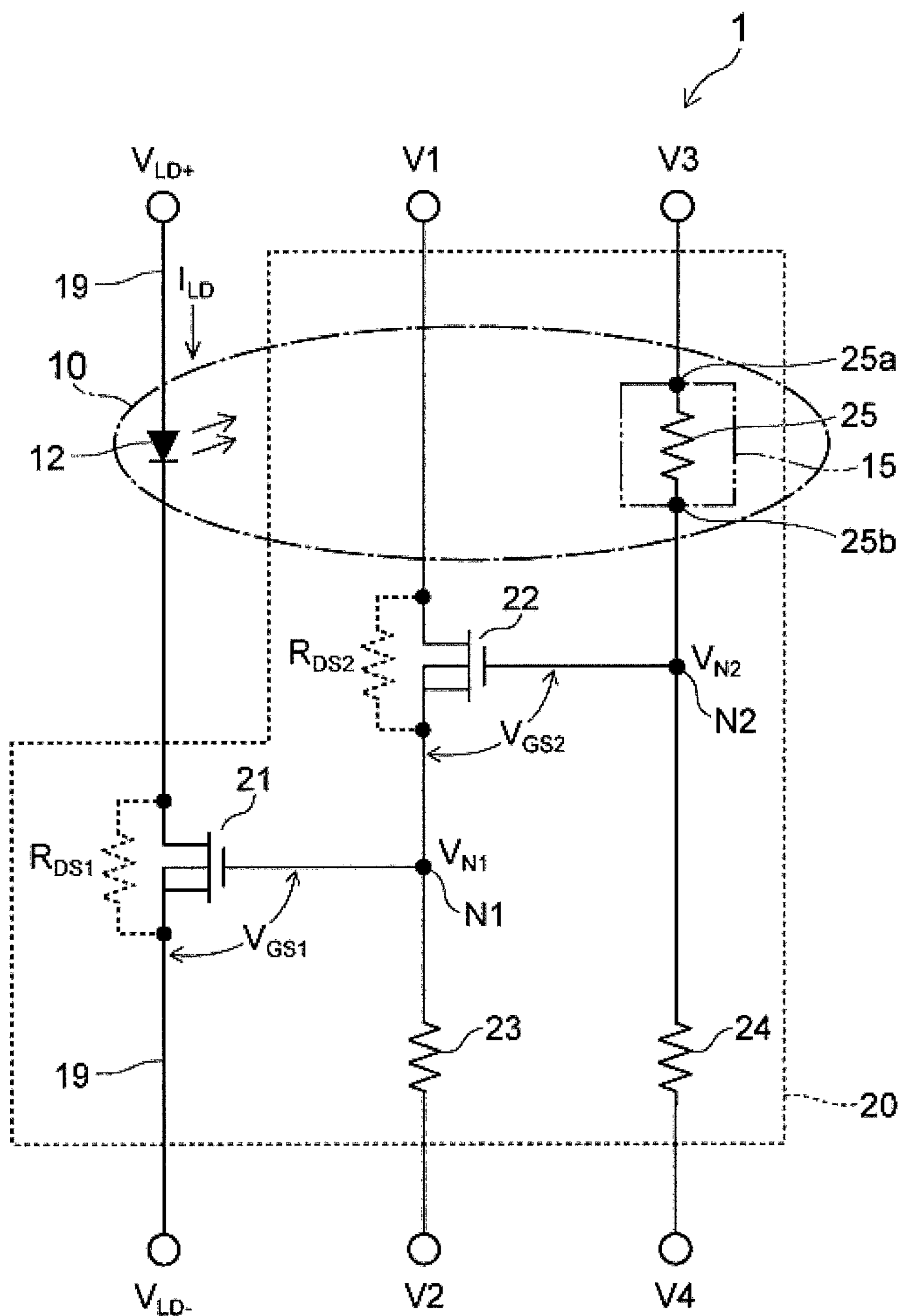
FIG. 1 is a circuit diagram of a light emitting module according to a first embodiment.

The embodiments will now be described with reference to the accompanying drawings, wherein like reference numerals designate corresponding or identical elements throughout the various drawings.

First Embodiment

A first embodiment of the present disclosure will be explained first.

FIG. 1 is a circuit diagram of a light emitting module according to this embodiment.

Figure 2A:
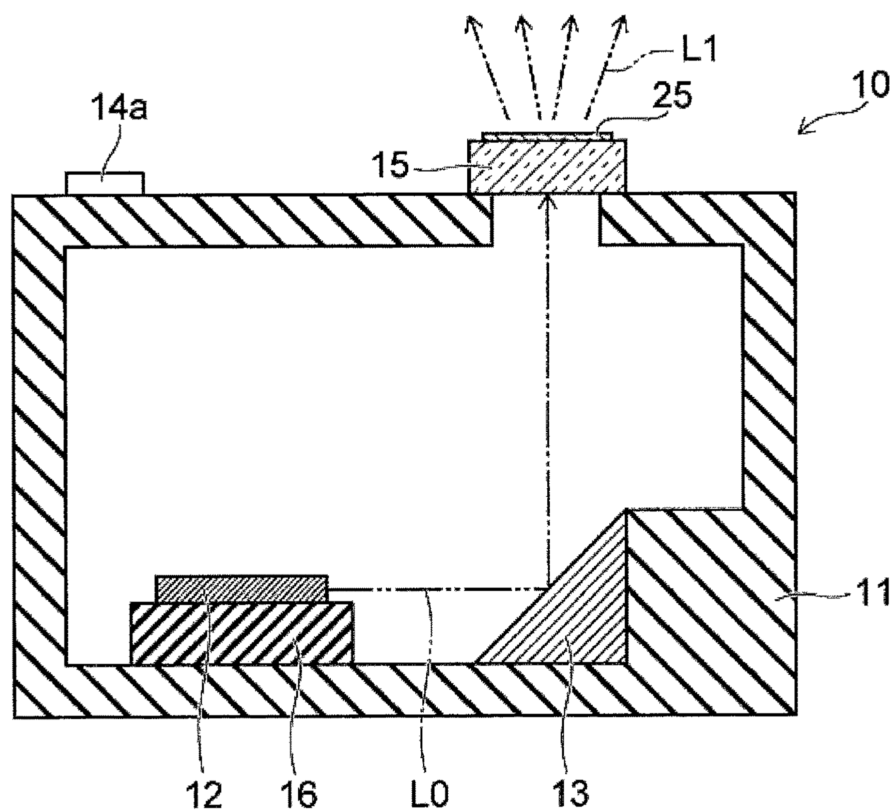
FIG. 2A is a cross-sectional view showing a light emitting device of the light emitting module according to the first embodiment.
Figure 2B:
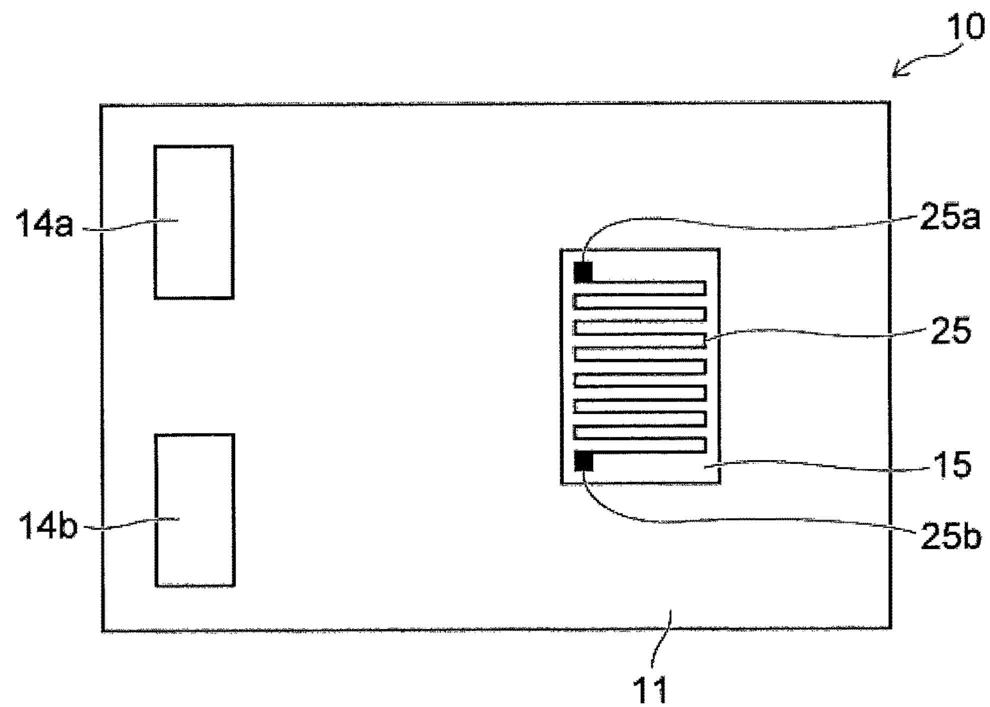
FIG. 2B is a top view FIG. 2A.

FIG. 2A is a cross-sectional view of the light emitting module according to this embodiment, and FIG. 2B is a top view of the same.

As shown in FIG. 1, FIGS. 2A and 2B, the light emitting module 1 according to this embodiment is provided with a light emitting device 10 and a stop circuit 20.

The light emitting device 10 is provided with a case 11. A submount 16 is secured onto the internal bottom face of the case 11, and a LD 12 employed as a laser element is secured on the submount 16. The LD 12 emits, for example, a blue laser beam L0. An optical member 13 is disposed in the case 11 at the position where the laser beam L0 enters. The optical member 13 is a light reflecting member constructed with a base material and a reflecting film disposed on the surface of the base material. The base member may be, for example, glass or the like. The reflecting film may be, for example, dielectric multilayer film or the like. The light reflecting member reflects the laser beam L0 emitted from the LD 12 towards a conversion member 15. On the outer surface of the case 11, a pair of electrodes 14*a* and 14*b* for supplying power to the LD 12 is disposed.

The case 11 is provided with an opening, and the conversion member 15 is disposed at the position to close the opening. The conversion member 15 is disposed at the position where the laser beam L0 enters. The conversion member 15 contains a phosphor that converts the laser beam L0 into light of a different wavelength. A phosphor is dispersed in the base material, which mainly contains a transparent material, of the conversion member 15. The phosphor is, for example, a YAG phosphor that absorbs blue light and emits yellow light.

As shown in FIG. 1, in the stop circuit 20, a first transistor 21, a second transistor 22, a first resistor 23, a second resistor 24, and a sensing wire 25 are disposed. Among these, the first transistor 21, the second transistor 22, the first resistor 23, and the second resistor 24 can be disposed on a circuit board that is separated from the light emitting device 10. The circuit board can be integrated into the light emitting device. Alternatively, the light emitting device 10 can be disposed on the circuit board. The sensing wire 25 will be described later. The structure of the stop circuit 20 will be briefly explained in (1) to (5) below.

(1) The LD 12 and the first transistor 21 are serially connected between the positive-side LD power supply potential $V_{LD+}$ and the negative-side LD power supply potential $V_{LD-}$.

(2) The second transistor 22 and the first resistor 23 are serially connected between a first reference potential V1 and a second reference potential V2. The node N1 at which the second transistor 22 is connected to the first resistor 23 is connected to the gate of the first transistor 21.

(3) The sensing wire 25 and the second resistor 24 are serially connected between a third reference potential V3 and a fourth reference potential V4. The node N2 at which the sensing wire 25 is connected to the second resistor 24 is connected to the gate of the second transistor 22.

(4) The first reference potential V1 is a potential that turns on the first transistor 21, if a voltage is applied to the gate of the first transistor 21. The second reference potential V2 is a potential that turns off the first transistor 21, if applied to the gate of the first transistor 21. Using the gate of the first transistor 21 as a reference, in the circuit, the second transistor 22 is disposed on the on-potential side, and the first resistor 23 is disposed on the off-potential side.

(5) The third reference potential V3 is a potential that turns on the second transistor 22, if applied to the gate of the second transistor 22. The fourth reference potential V4 is a potential that turns off the second transistor 22, if applied to the gate of the second transistor 22. Using the gate of the first transistor 21 as a reference, in the circuit, the sensing wire 25 is disposed on the on-potential side, and the second resistor 24 is disposed on the off-potential side, respectively.

The structure of the stop circuit 20 will be explained in detail below.

The first transistor 21 and the second transistor 22 are, for example, n-channel type MOSFETs (i.e., metal-oxide-semiconductor field-effect transistors). In this case, the first reference potential V1 is higher than the second reference potential V2, and the third reference potential V3 is higher than the fourth reference potential V4. In this embodiment, the positive-side LD power supply potential $V_{LD+}$, the negative-side LD power supply potential $V_{LD-}$, the first reference potential V1, the second reference potential V2, the third reference potential V3, and the fourth reference potential V4 are independent of one another.

In the case where the first transistor 21 is a p-channel type transistor, the first reference potential V1 is lower than the second reference potential V2. In the case where the second transistor 22 is a p-channel type transistor, the third reference potential V3 is lower than the fourth reference potential V4. An example where the first transistor 21 and the second transistor 22 are n-channel type transistors will be explained below. The first transistor 21 and the second transistor 22 are transistors having, for example, the same standard.

The anode of the LD 12 is connected to the LD power supply potential $V_{LD+}$ via the electrode 14*a*. The cathode of the LD 12 is connected to the drain of the first transistor 21 via the electrode 14*b*. The source of the first transistor 21 is connected to the LD power supply potential $V_{LD-}$. In the description herein, the phrase, "a member is connected to a potential," means that the potential is applicable to that member, and it's not necessarily the case where the potential is always being applied to the member. For example, the potential is applied to the member when the light emitting module is in operation, but not applied when not in operation.

The first transistor 21 may be connected between the LD power supply potential $V_{LD+}$ and the anode of the LD 12. To describe in more general terms, assuming that the source or the drain of a transistor is the "first electrode," the other is the "second electrode, and the gate is the "control electrode", the first electrode of the first transistor 21 can simply be connected to the LD 12 and the second electrode of the first transistor 21 can simply be connected to the power supply wiring 19 which supplies power to the LD 12. In other words, the first transistor 21 can simply be present on the power supply wiring 19.

The drain of the second transistor 22 is connected to the first reference potential V1, and the source of the second transistor 22 is connected to the gate (i.e., control electrode) of the first transistor 21 and one end of the first resistor 23. The other end of the first resistor 23 is connected to the second reference potential V2. To describe in more general terms, the first electrode (i.e., the source or the drain) of the second transistor 22 is connected to the control electrode of the first transistor 21, and the second electrode (i.e., the other of the two) of the second transistor 22 is connected to the first reference potential V1.

As shown in FIG. 1, FIGS. 2A and 2B, the sensing wire 25 is a piece of wire, in which the terminal 25*a* at one end is connected to the third reference potential V3, and the other terminal 25*b* is connected to the gate (i.e., control electrode) of the second transistor 22 and one end of the second resistor 24. The sensing wire 25 is fixed to the surface of the conversion member 15 that structures an exterior face of the light emitting device 10 by being arranged to meander across substantially the entire surface. The sensing wire 25 is formed with a light transmissive conductive material, such as ITO (i.e., indium-tin-oxide) or the like. The sensing wire 25 is disposed on the light extraction face of the conversion member 15 in the example shown in FIGS. 2A and 2B, but may be disposed on the face of the conversion member 15 where the laser beam L0 enters or embedded in the conversion member 15. To describe in more general terms, the sensing wire 25 can simply be mechanically connected to the conversion member 15.

The sensing wire 25 does not have to be in contact with the conversion member 15. For example, a light transmissive material may be fixed to the surface of the conversion member 15, while disposing the sensing wire 25 on the surface of the light transmissive material. With the sensing wire 25 mechanically connecting with the conversion member 15, a damage or separation of the conversion member 15 cause a damage or breakage of the sensing wire 25 to thereby increase the resistance value of the sensing wire 25. This allows the stop circuit 20 to detect the damage generated on the conversion member 15. In other words, the sensing wire 25 is a resistor for damage detection. The sensing wire 25 may be formed with a metal material besides a light transmissive conductive material. However, when disposing the sensing wire 25 in the primary path of light, as shown in FIGS. 2A and 2B, the sensing wire 25 is preferably formed with a light transmissive conductive material in order to lessen the degree of optical output decline of the light emitting device 10. In this case, the terminals 25*a* and 25*b* of the sensing wire 25 may be formed with a metal material.

As shown in FIG. 1, one end of the second resistor 24 is connected to the terminal 25*b* of the sensing wire 25 and the gate (i.e., control electrode) of the second transistor 22, while the other end is connected to the fourth reference potential V4. For example, the resistance value of the first resistor 23 is lower than the resistance value of the second resistor 24. For example, the resistance value of the first resistor 23 can be set to one-ten-thousandth to one-hundredth of the resistance value of the second resistor 24.

Next, the operation of the light emitting module 1 according to the embodiment will be explained.

The normal operation will be explained first.

The third reference potential V3 is applied to the terminal 25*a* of the sensing wire 25, and the fourth reference potential V4 is applied to the other end of the second resistor 24. This applies to the gate of the second transistor 22 a potential which is between the third reference potential V3 and the fourth reference potential V4 and is determined by dividing resistance between the sensing wire 25 and the second resistor 24 to thereby turn on the second transistor 22. In other words, the resistance value of the second resistor 24 is determined by balancing it with the resistance value of the sensing wire 25 so as to turn on the second transistor 22.

A first reference potential V1 is applied to the drain of the second transistor 22, and a second reference potential V2 is applied to the other end of the first resistor 23. This applies to the gate of the first transistor 21 a potential which is between the first reference potential V1 and the second reference potential V2 and is determined by resistance division between the internal resistance of the second transistor 22 and the first resistor 23 to thereby turn on the first transistor 21. In other words, the resistance value of the first resistor 23 is determined by balancing it with the internal resistance of the second transistor 22 so as to turn on the first transistor 21 when the second transistor 22 is on.

When the LD power supply potential $V_{LD+}$ is applied to the electrode 14*a* in the state where the source of the first transistor 21 is connected to the LD power supply potential $V_{LD-}$, because the first transistor 21 is on, a predetermined voltage is applied to the LD 12, and the LD 12 emits, for example, a blue laser beam L0. The laser beam L0 enters the conversion member 15. The phosphor in the conversion member 15 absorbs a portion of the entered laser beam L0, and emits light having a different wavelength from that of the laser beam L0, for example, yellow light. In this manner, the conversion member 15 releases white light L1 in which the blue light of scattered laser beam L0 and the yellow light emitted by the phosphor are mixed. A portion of the white light L1 passes through the sensing wire 25, and the remaining portion passes through the spaces between portions of the sensing wire 25 to be externally released from the light emitting device 10.

The operation in the case where the conversion member 15 has been damaged will be explained next.

Once the conversion member 15 is damaged by, for example, an external shock or the like, the following events (a) to (e) will occur.

(a) When the conversion member 15 is damaged, the sensing wire 25 disposed to the surface of the conversion member 15 will be broken.

(b) When the resistance is divided in (a) above, the potential $V_{N2}$ of the node N2 declines to approach the fourth reference potential V4, and the gate-source voltage $V_{GS2}$ of the second transistor 22 declines. At this point, the electrical charge accumulated in the internal capacitor of the second transistor 22 are discharged to the fourth reference potential V4 via the second resistor 24.

(c) When the voltage $V_{GS2}$ declines as described in (b) above, the drain-source resistance $R_{DS2}$ of the second transistor 22 increases. When the gate-source voltage $V_{GS2}$ of the second transistor 22 becomes the threshold value or lower, the second transistor 22 will turn off.

(d) When the resistance $R_{DS2}$ increases as described in (c) above, the resistance is divided with the first resistor 23, and the potential $V_{N1}$ of the node N1 declines to approach the second reference potential V2. At this point, the electrical charge accumulated in the internal capacitor of the first transistor 21 are discharged to the second reference potential V2 via the first resistor 23. When the potential $V_{N2}$ of the node N2 declines, the potential $V_{N1}$ of the node N1 also declines in synchronization with that. As a result, the gate-source voltage $V_{GS1}$ of the first transistor 21 declines.

(e) When the voltage $V_{GS1}$ declines as described in (d) above, the drain-source resistance $R_{DS1}$ of the first transistor 21 increases. When the gate-source voltage $V_{GS1}$ of the first transistor 21 becomes the threshold value or lower, the first transistor 21 turns off. This turns off the LD 12.

In actuality, when the event described in (a) above occurs, the events described in (b) to (e) above progress substantially simultaneously. For this reason, accelerating any of the events described in (b) to (e) above reduces the overall response time, thereby allowing the LD 12 to turn off in a short period of time.

The effect of the embodiment will be explained next.

According to the embodiment of the present disclosure, the LD 12 employed as a laser element can be turned off when the conversion member 15 is damaged. This can reduce the possibility of direct leakage of the laser beam L0 from the light emitting device 10 without passing through the conversion member 15.

In the present embodiment, the sensing wire 25 is independent from the power supply wiring 19 of the LD 12. For this reason, the LD 12 and the stop circuit 20 can be driven independently, allowing both to operate in a stable manner. Because a large current to drive the LD 12 (hereinafter referred to as "LD current $I_{LD}$") never flows through the sensing wire 25, the sensing wire 25 can be formed finely and thinly. As a result, the percentage of the white light L1 blocked by the sensing wire 25 can be reduced to thereby improve the light extraction efficiency of the light emitting module 1. The width of the sensing wire 25 can be set to, for example, 5 μm to 200 μm. The thickness of the sensing wire 25 can be set to, for example, 50 μm to 200 nm.

A fine and thin sensing wire 25 can be more certainly cut or given adequately high resistance when the conversion member 15 gets damaged. The sensing wire 25 can have high resistance when at least a portion thereof is damaged. The sensing wire 25 having adequately high resistance refers to the level of high resistance that brings the gate-source voltage $V_{GS2}$ of the second transistor 22 to the threshold value or lower. This allows the events described in (d) and (e) above to progress. Because the circuit's current consumption increases as the current flowing through the normal sensing wire 25 (i.e., undamaged sensing wire 25) increases, the current flowing through the sensing wire 25 can be set to, for example, 100 mA at most. The current flowing through the sensing wire 25 is preferably 1 mA at most. The current running through the sensing wire 25 may be set to at least 1 μA.

According to the embodiment, furthermore, the resistance value of the first resistor 23 can be decided by balancing that with the internal resistance of the second transistor 22. Because the internal resistance of the second transistor 22 is quite small when it is on, the resistance value for the first resistor 23 can also be set relatively low. This allows the electrical charge accumulated in the internal capacitor of the first transistor 21 to be quickly discharged to the second reference potential V2 via the first resistor 23 in the operation described in (d) above, thereby quickly reducing the potential $V_{N1}$ of the node N1 towards the second reference potential V2. As a result, the events described in (b) to (d) above can progress quickly as a whole to thereby rapidly turn off the LD 12.

The resistance value of the second resistor 24 is relatively high as it is determined by balancing it with the sensing wire 25. This, however, has small impact on the time required to turn off the LD 12 because the electrical charge accumulated in the internal capacitor of the first transistor 21 do not pass through the second resistor 24. Furthermore, setting the second resistor 24 relatively high can reduce the current flowing from the third reference potential V3 to the fourth reference potential V4. This can consequently reduce the current consumption of the light emitting module 1 as well as reducing the current flowing through the sensing wire 25.

According to the embodiment, the circuit is structured to automatically turn off the DL 12 when there is a breakage in the sensing wire 25, yet the amount of current flowing to the LD 12, the amount of current flowing through the sensing wire 25, and the response time from a breakage in the sensing wire 25 to the LD 12 being turned off can be independently adjusted. This thus can achieve a light emitting module having a high response speed and small current consumption.

Assuming that the internal capacitance of the first transistor 21 is C1, the internal capacitance of the second transistor 22 is C2, the resistance value of the first resistor 23 is R1, and the resistance value of the second resistor 24 is R2, (C1×R1) is the time constant of the first transistor 21 during the on-to-off transition period, and (C2×R2) is the time constant of the second transistor 22 during the on-to-off transition period. That is, the smaller the (C1×R1) value is, the time taken until the first transistor 21 is turned off, and the smaller the (C2×R2) value is, the shorter time it takes until the second transistor 22 is turned off. The smaller the (C1×R1) value is, the more preferable it is; specifically, $1\times10^{-4}$ seconds at most is preferable. The (C1×R1) value is, for example, is at least $1\times10^{-9}$ seconds. The smaller the (C2×R2) value is, the more preferable it is; specifically, $1\times10^{-4}$ seconds at most is preferable. The (C×R2) value, for example, is at least $1\times10^{-9}$ seconds.

The smaller the ratio of the second resistor 24 resistance value with respect to the sum of the sensing wire 25 resistance value and the second resistor 24 resistance value is, the lower the potential $V_{N2}$ of the node N2 becomes. The resistance value of the sensing wire 25 and the resistance value of the second resistor 24 are set so that the potential $V_{N2}$ becomes the value that turns on the second transistor 22. Such a potential $V_{N2}$ value can be achieved even when the resistance value of the second resistor 24 is lower than the resistance value of the sensing wire 25, but that would require a high value for the third reference potential V3, for example, about several tens of volts. For this reason, setting the resistance value of the second resistor 24 higher than the resistance value of the sensing wire 25 can reduce the third reference potential V3 and thus is preferable.

The higher the resistance value of the second resistor 24 is, the longer time it tends to take from a breakage or the like of the sensing wire 25 until the second transistor 22 is turned off. The lower the resistance value of the sensing wire 25, the lower the resistance value of the second resistor 24 can be. For this reason, the resistance value of the sensing wire 25 is preferably set to 1 mΩ at most. The resistance value of the sensing wire 25 can be set to several mΩ or higher when a metal, for example, is used for the sensing wire 25. Alternatively, the resistance value of the sensing wire 25 can be set to 100Ω or higher when ITO is used. In order to reduce the resistance value of the sensing wire 25, the width of the sensing wire 25 can be set, for example, to about 10 μm to about 500 μm. The resistance value of the sensing wire 25 can be more easily reduced when a metal material is used for the sensing wire 25 as compared to a light transmissive conductive material such as ITO.

In this embodiment, an example which uses MOSFETs for the first transistor 21 and the second transistor 22 has been described without any intention to limit the present invention. At least one of the first and second transistors 21 and 22 may be, for example, a bipolar transistor. In this case, either the emitter or the collector serves as the "first electrode", the other of the two serves as the "second electrode", and the base serves as the "control electrode". In the case of employing a bipolar transistor for the first transistor 21, a resistor is preferably disposed between the base and the node N1 in order to control the current flowing from the base to the bipolar transistor. In the case of employing a bipolar transistor for the second transistor 22, a current controlling resistor may similarly be disposed between the base and the node N2, or the sensing wire 25 may be used to concurrently serve as a current controlling resistor. It is preferable to use FETs for the first transistor 21 and the second transistor 22 rather than bipolar transistors in order to reduce the current flowing to the sensing wire 25 to thereby reduce the current consumption of the circuit.

In the embodiment, an example of the light emitting device 10 in which the LD 12 and the conversion member 15 are fixed to and integrated with the same case 11 has been described without any intention to limit the present invention. The LD 12 and the conversion member 15 may be disposed as separate bodies. Moreover, the laser element is not required to be a blue light emitting laser diode, and the phosphor is not required to be one that emits yellow light. Furthermore, the shape of the conversion member is not required to be a plate shape, and may be, for example, a spherical shape. The conversion member is a member that converts the wavelength of and scatters a laser beam. The conversion member may contain at least one phosphor, or contains substantially no phosphor but scattering particles. The optical member is not required to be a light reflecting member, and may be, for example, a prism. The optical member does not have to be disposed depending on the relative positions of the laser element and the conversion member.

With reference to this embodiment, six potentials externally supplied to drive the light emitting module 1 have been explained, which is, the LD power supply potential $V_{LD+}$, the LD power supply potential $V_{LD-}$, the first reference potential V1, the second reference potential V2, the third reference potential V3, and the fourth reference potential V4. These potentials may be mutually independent, but those potentials, if possible, may be combined as explained with reference to the second and third embodiments below.

Second Embodiment

A second embodiment of the present disclosure will be explained next.

Figure 3:
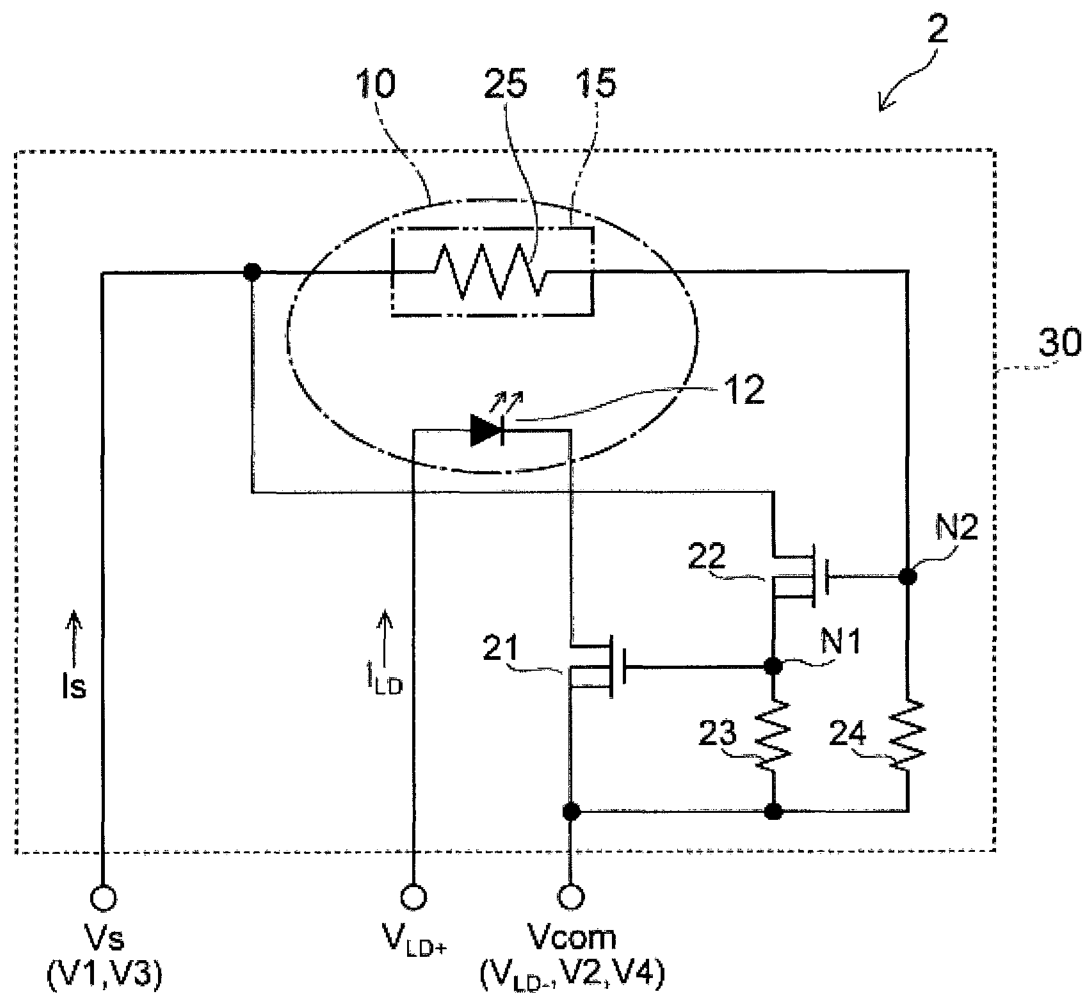
FIG. 3 is a circuit diagram of a light emitting module according to a second embodiment.

FIG. 3 is a circuit diagram of a light emitting module according to the embodiment.

As shown in FIG. 3, the light emitting module 2 according to the embodiment differs from the light emitting module 1 according to the first embodiment described earlier (FIGS. 1, 2A, and 2B) in that a stop circuit 30 is disposed instead of a stop circuit 20. In the stop circuit 30, the first reference potential V1 and the third reference potential V3 are made common as a sensing potential $V_S$. The negative-side LD power supply potential $V_{LD-}$, the second reference potential V2, and the fourth reference potential V4 are made common as a common potential Vcom. The common potential Vcom is, for example, a grounding potential (GND). The positive side LD power supply potential $V_{LD+}$ is independent of the sensing potential $V_S$. The total value of the current flowing from the sensing potential $V_S$ to the common potential Vcom is referred to as a sensing current $I_S$.

According to this embodiment, only three potentials, i.e., the positive side LD power supply potential $V_{LD+}$, the sensing potential $V_S$, and the common potential Vcom, can simply be provided as the power supply potentials for operating the light emitting module 2. For this reason, the implementation of the light emitting module 2 according to the second embodiment is easier and the structure of the stop circuit 30 can be simplified as compared to the light emitting module 1 according to the first embodiment (FIG. 1). Because the LD power supply potential $V_{LD+}$ and the sensing potential $V_S$ are mutually independent, the LD 12 and the stop circuit 30 can be independently operated in a stable manner.

The other particulars, the operation and the effect of the embodiment are similar to those in the first embodiment described earlier.

Third Embodiment

A third embodiment of the present disclosure will be explained next.

Figure 4:
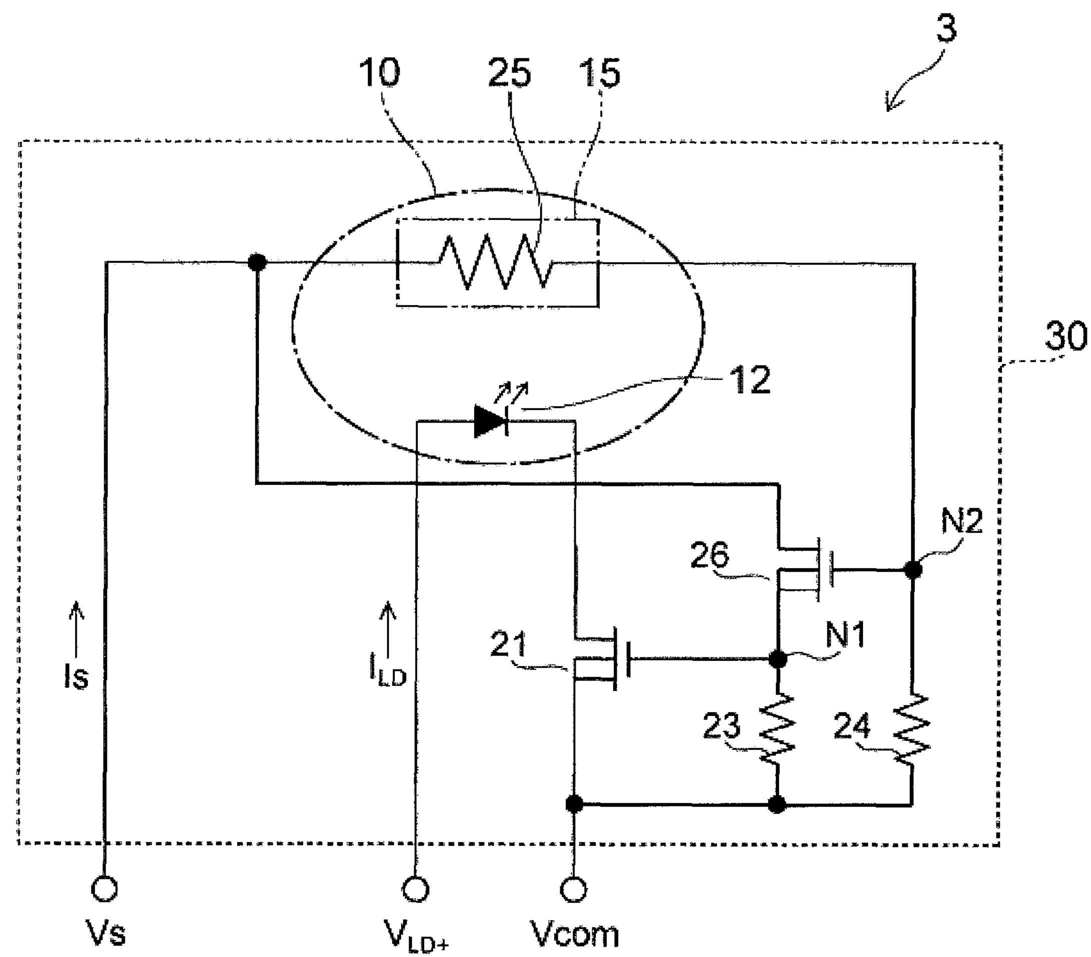
FIG. 4 is a circuit diagram of a light emitting module according to a third embodiment.

FIG. 4 is a circuit diagram of a light emitting module according to the present embodiment.

As shown in FIG. 4, the light emitting module 3 according to the third embodiment differs from the light emitting module 2 (FIG. 3) according to the second embodiment described earlier in that a second transistor 26 is disposed instead of a second transistor 22. The internal capacitance of the second transistor 26 is smaller than the internal capacitance of the first transistor 21. A small signal transistor with small internal capacitance can be used for the second transistor 26 because only a portion of the sensing current $I_S$ flows therethrough, i.e., no LD current $I_{LD}$ flows therethrough. The internal capacitance of the first transistor 21 can be set to, for example, 100 pF to 10,000 pF. The internal capacitance of the second transistor 26 can be set to, for example, 1 pF to 100 pF. In the description herein, the term, internal capacitance, refers to control terminal capacitance, and in the case of a FET, for example, refers to gate capacitance.

Because the higher the resistance value of the second resistor 24, the smaller the current flowing through the sensing wire 25 can be as described earlier, the resistance of the second resistor 24 tends to be set higher than the first resistor 23. For this reason, the internal capacitance of the second transistor 26 is preferably set smaller than that of the first transistor 21 to thereby reduce the time constant of the second transistor 26 during the on-to-off transition period.

In this embodiment, the internal capacitance of the second transistor 26 is small, and the amount of accumulated electrical charge is small. Accordingly, when the sensing wire 25 is broken, the electrical charge accumulated in the internal capacitor of the second transistor 26 are quickly discharged to the common potential Vcom via the second resistor 24, swiftly lowering the potential of the node N2. This can accelerate the event described in (b) above, increasing the overall response speed. As a result, the LD 12 can be turned off more quickly, improving the safety.

The other particulars, the operation and the effect of the third embodiment are similar to those in the second embodiment described above.

Comparative Example

A comparative example will be explained next.

Figure 5:
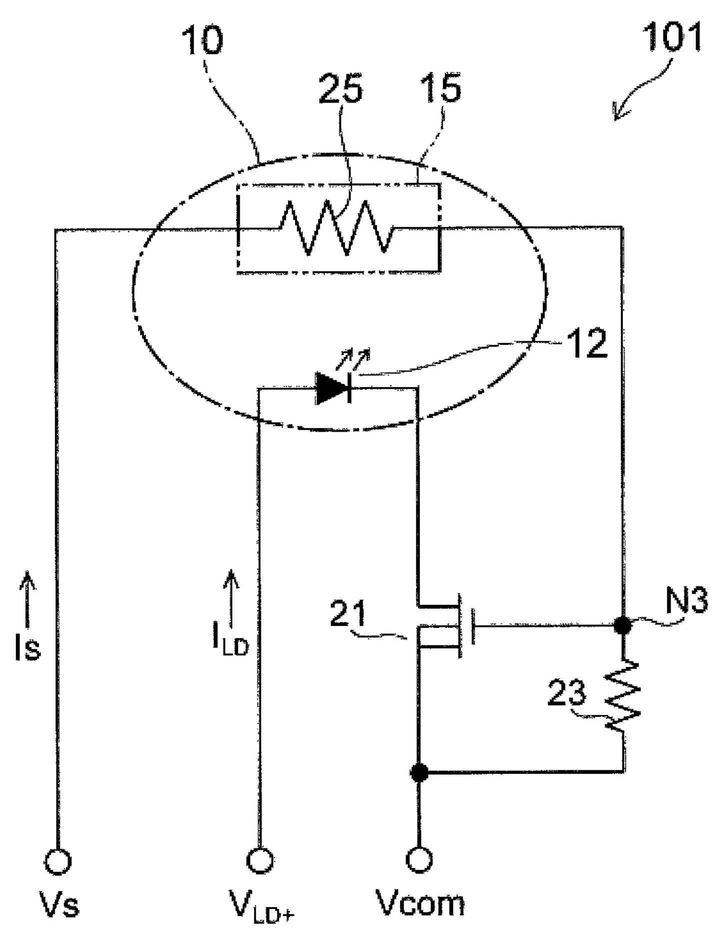
FIG. 5 is a circuit diagram of a light emitting module according to a comparative example.

FIG. 5 is a circuit diagram of a light emitting module according to a comparative example.

As shown in FIG. 5, the light emitting module 101 of the comparative example differs from the light emitting module 2 according to the second embodiment described earlier (see FIG. 3) in that there is no second transistor 22 or the second resistor 24, the sensing wire 25 is connected to the first resistor 23, and the node N3 at which the sensing wire 25 is connected to the first resistor 23 is connected to the gate of the first transistor 21.

In the light emitting module 101 of the comparative example, the first transistor 21 turns on when a potential falling between the sensing potential $V_S$ and the common potential Vcom determined by resistance division between the resistance value of the sensing wire 25 and the first resistor 23 is applied to the gate of the first transistor 21. When the conversion member 15 is damaged or separated, the sensing wire 25 will be broken, and the gate potential of the first transistor 21 will approach the common potential Vcom. This turns off the first transistor 21, turning off the LD 12.

In the comparative example, the first transistor 21 is directly affected by a breakage in the sensing wire 25 because the gate is connected to the sensing wire 25, and is directly involved in the energization of the LD 12 because the source and the drain are connected to the LD 12 and the common potential Vcom. The first resistor 23 is also directly affected by a breakage in the sensing wire 25 because it is connected to the sensing wire 25, and is directly involved in discharging the electrical charge accumulated in the internal capacitor of the first transistor 21 because it is connected to the gate of the first transistor 21. As such, the first transistor 21 and the first resistor 23 affect the amount of current flowing to the LD 12, the amount of current flowing to the sensing wire 25, and the response time from a breakage of the sensing wire 25 till the LD 12 is turned off, these cannot be independently adjusted.

For example, in the comparative example, the resistance value of the first resistor 23 is set higher than that in the second embodiment in order to balance it with the resistance value of the sensing wire 25. Specifically, the resistance value of the first resistor 23 needs to be adjusted so that the potential determined by resistance division between the resistance value of the sensing wire 25 and the resistance value of the first resistor 23 turns on the first transistor 21. This delays the discharge of the electrical charge accumulated in the parasitic capacitance of the first transistor 21, thereby extending the time from a breakage in the sensing wire 25 until the LD 12 is turned off.

In contrast, in each of the embodiments of the present disclosure described earlier, the second transistor 22 which can be affected by a breakage in the sensing wire 25 is separately disposed from the first transistor 21 that controls the supply of power to the LD 12. The circuit is structured to automatically turn off the DL 12 when there is a breakage in the sensing wire 25, and yet the amount of current flowing to the LD 12, the amount of current flowing through the sensing wire 25, and the response time until the LD 12 is turned off can be independently adjusted. For example, the amount of current flowing to the sensing wire 25 can be adjusted by the resistance value of the second resistor 24.

Testing

The testing performed to demonstrate the effects of the embodiments described above will be explained below.

Figure 6:
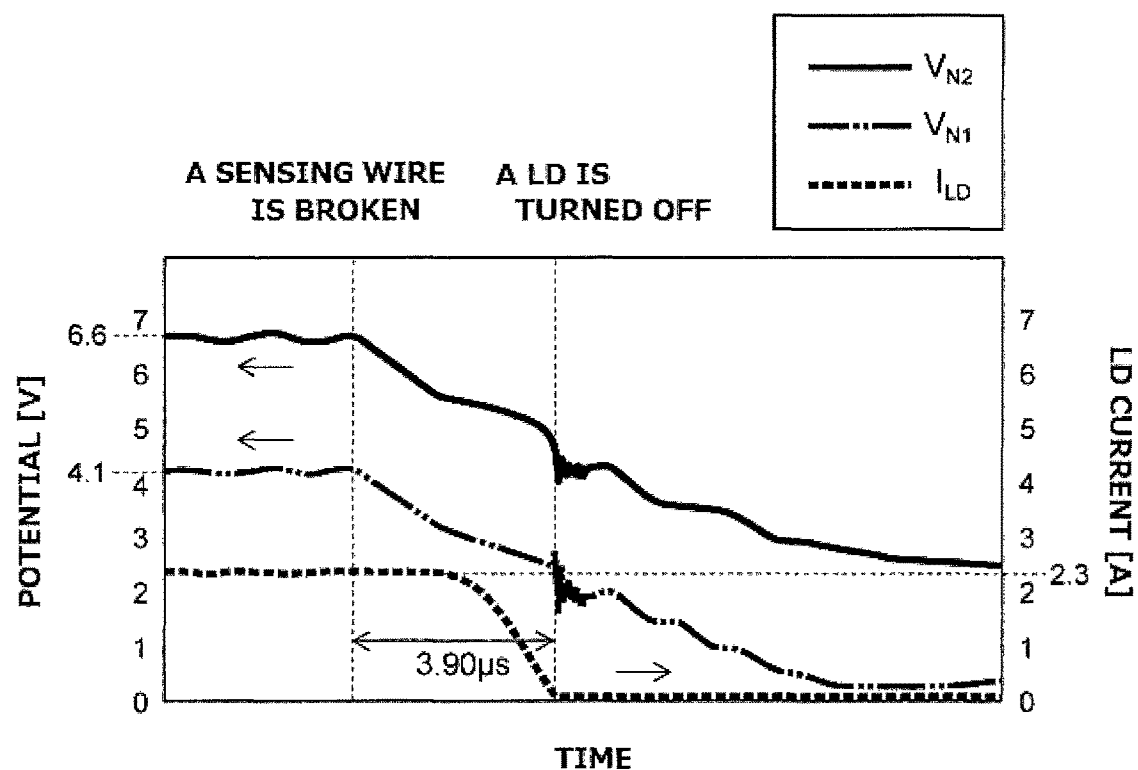
FIG. 6 is a graph showing the results of the performance test on the light emitting module according to the second embodiment where the horizontal axis represents time and the vertical axis represents potential and LD current at each node.

FIG. 6 is a graph showing the results of the performance test conducted on the light emitting module according to the second embodiment, where the horizontal axis represents time, and the vertical axis represents the potential at each node and LD current.

Figure 7:
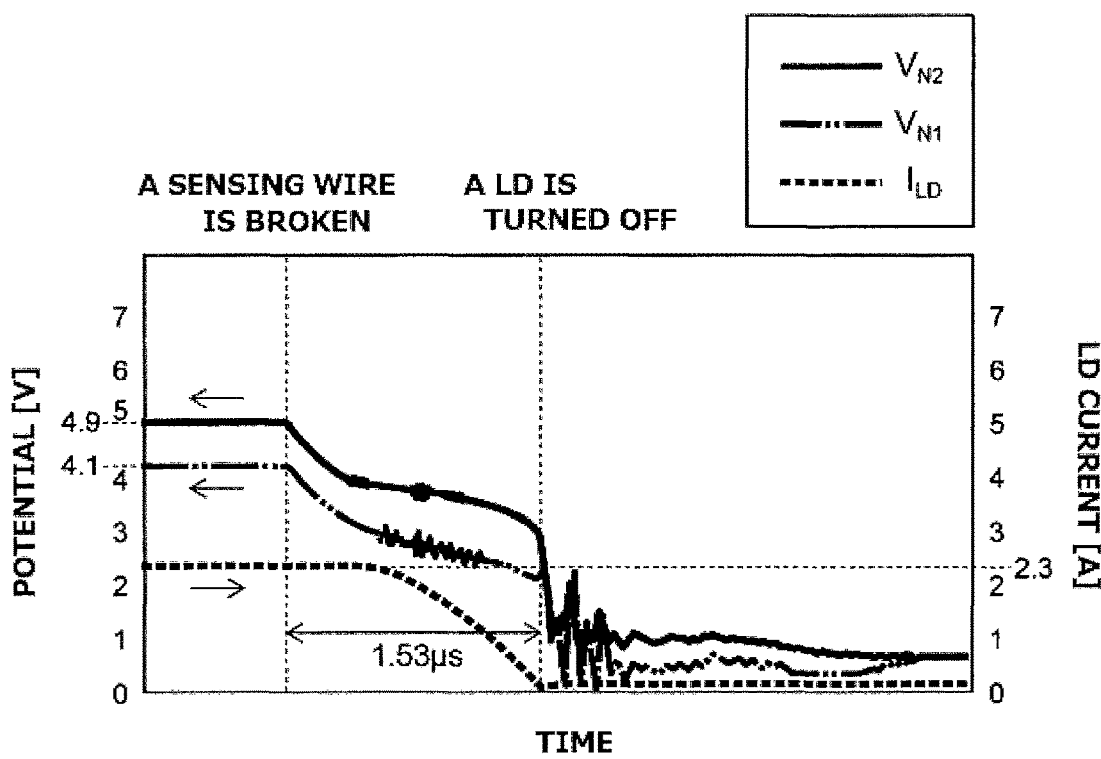
FIG. 7 is a graph showing the results of the performance test on the light emitting module according to the third embodiment in which the horizontal axis represents time and the vertical axis represents potential and LD current at each node.

FIG. 7 is a graph showing the results of the performance test conducted on the light emitting module according to the third embodiment, where the horizontal axis represents time, and the vertical axis represents the potential at each node and LD current.

Figure 8:
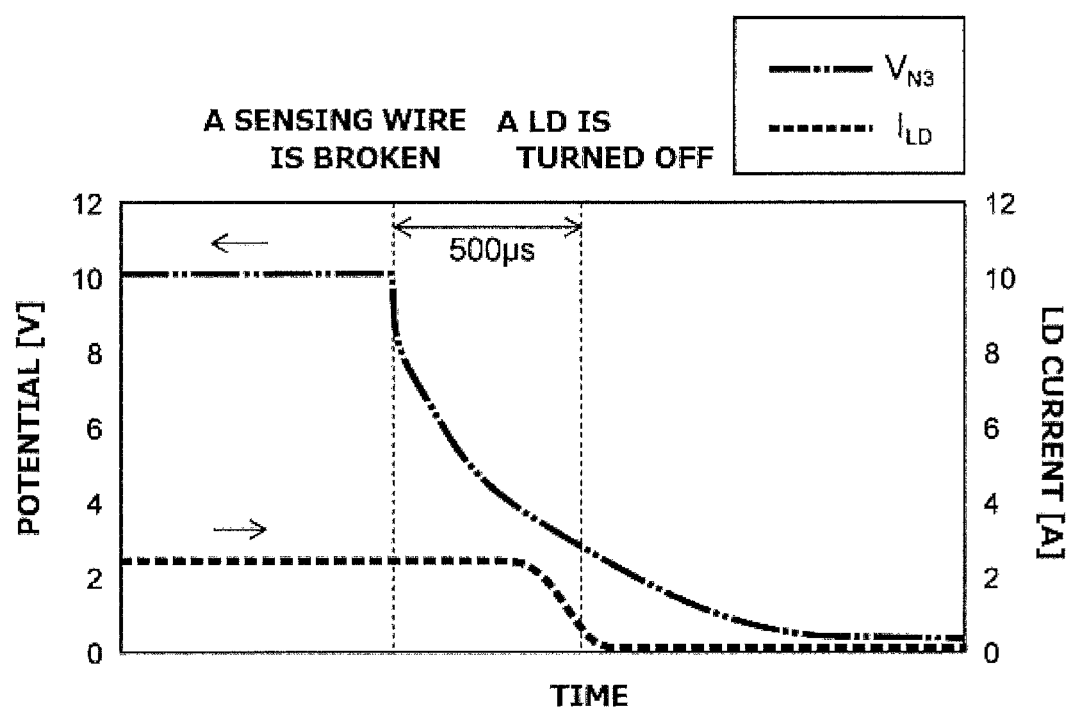
FIG. 8 is a graph showing the results of the performance test on the light emitting module according to the comparative example in which the horizontal axis represents time and the vertical axis represents potential and LD current at each node.

FIG. 8 is a graph showing the results of the performance test conducted on the light emitting module according to the comparative example, where the horizontal axis represents time, and the vertical axis represents the potential at each node and LD current.

For testing, a sample of the light emitting module 2 according to the second embodiment (see FIG. 3), a sample of the light emitting module 3 according to the third embodiment (see FIG. 4), and a sample of the light emitting module 101 according to the comparative example (see FIG. 5) were prepared. With respect to these samples, the changes in the potential $V_{N1}$ of the node N1, the changes in the potential $V_{N2}$ of the node N2, the changes in the potential $V_{N3}$ of the node N3, and the changes in the LD current $I_{LD}$ flowing to the LD 12 after breaking the sensing wire 25 were measured. In order to increase the testing accuracy, instead of cutting the sensing wire 25 by damaging the conversion member 15, a switch serially connected between the sensing wire 25 and the node N3 in each sample was turned off in the present testing.

Table 1 shows the common test conditions. Table 2 and Table 3 show sample specific test conditions. Table 4 shows the test results. The "Sensing Current $I_S$" column in Table 4 shows the total current flowing from the sensing potential $V_S$ to the common potential Vcom, and the "Current Flowing through Sensing Wire 25" column shows the current flowing through the sensing wire 25 among the sensing current $I_S$.

The "SSM3K341R" manufactured by Toshiba was used for the first transistor 21 in each sample and for the second transistor 22 in the sample according to the second embodiment. The "SSM3K56MFV" manufactured by Toshiba was used for the second transistor 26 in the sample according to the third embodiment.

TABLE 1

| Item | Value |
|---|---|
| LD Power Supply Potential $V_{LD+}$ | 10 V |
| LD Current (during normal operation) | 2.3 V |
| Sensing Potential $V_S$ | 10 V |
| Common Potential Vcom | GND |
| Resistance Value of Sensing Wire 25 | 47 kΩ |

TABLE 2

| Sample | Resistance Value of First Resistor 23 (kΩ) | Resistance Value of Second Resistor 24 (kΩ) | Potential $V_{N1}$ of Node N1 (V) | Potential $V_{N2}$ of Node N2 (V) |
|---|---|---|---|---|
| Second Embodiment | 0.10 | 100 | 4.1 | 6.6 |
| Third Embodiment | 0.33 | 47 | 4.1 | 4.9 |
| Comparative Example | 470 | — | | — |

TABLE 3

| Sample | First Transistor 21 | | Second Transistor 22/26 | |
|---|---|---|---|---|
| | Threshold Value (Min./Max.) (V) | Internal Capacitance (pF) | Threshold Value (Min./Max.) (V) | Internal Capacitance (pF) |
| Second Embodiment | 1.5/2.5 | 300 | 1.5/2.5 | 300 |
| Third Embodiment | 1.5/2.5 | 300 | 0.4/1.0 | 16 |
| Comparative Example | 1.5/2.5 | 300 | — | — |

TABLE 4

| Sample | Response Speed (μs) | Sensing Current $I_S$ (mA) | Current Flowing through Sensing Wire 25 (mA) |
|---|---|---|---|
| Second Embodiment | 3.90 | 41.1 | 0.07 |
| Third Embodiment | 1.53 | 12.6 | 0.11 |
| Comparative Example | 500 | 0.02 | 0.02 |

FIG. 6 to FIG. 8 and Table 4 shows the response time, from when the sensing wire 25 was broken (i.e., actually the switch connected to the sensing wire 25 was turned off), to when the LD 12 was completely turned off. The response time in the sample according to the second embodiment was 3.90 μs (microseconds), which is less than one-hundredth of 500 us for the sample according to the comparative example. The response time in the sample according to the third embodiment was 1.53 us which is less than one half of that of the second embodiment.

In the sample according to the second embodiment and the sample according to the third embodiment, the sensing current $I_S$ increased as compared to the comparative example sample. Moreover, the current flowing to the sensing wire 25 also increased as compared to the comparative example sample. However, the extent of such an increase is considered to pose no problem in practical use.

The embodiments described earlier are specific examples of the present disclosure, and are not intended to limit the present disclosure. The present disclosure encompasses, for example, variations of the embodiments in which certain constituent elements or steps are added, omitted, or modified.

The present disclosure can be utilized, for example, in lighting equipment, automotive headlights, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting module comprising:
a laser element to emit a laser beam:
a first transistor comprising:
a first electrode connected to the laser element;
a second electrode connected to a power supply; and
a control electrode;
a second transistor comprising:
a first electrode connected to a second reference potential via a first resistor, the control electrode of the first transistor being connected to the first electrode of the second transistor and the first resistor;
a second electrode connected to a first reference potential; and
a control electrode;
a conversion member to convert the laser beam emitted by the laser element into light having a wavelength different from a wavelength of the laser beam, the conversion member comprising:
a sensing wire via which the control electrode of the second transistor is connected to a third reference potential, the control electrode of the second transistor being connected to a fourth reference potential via a second resistor;
the first transistor being configured to be turned on when the first reference potential is applied to the control electrode of the first transistor;
the first transistor being configured to be turned off when the second reference potential is applied to the control electrode of the first transistor;
the second transistor being configured to be turned on when the third reference potential is applied to the control electrode of the second transistor; and
the second transistor being configured to be turned off when the fourth reference potential is applied to the control electrode of the second transistor.

2. The light emitting module according to claim 1, wherein a higher power supply potential of the power supply potentials to be supplied to the laser element is independent of the higher reference potential of the first reference potential and the second reference potential.

3. The light emitting module according to claim 1, wherein the second reference potential is equal to the fourth reference potential.

4. The light emitting module according to claim 1, wherein the first reference potential is equal to the third reference potential.

5. The light emitting module according to claim 1, wherein a resistance value of the first resistor is lower than a resistance value of the second resistor.

6. The light emitting module according to claim 1, wherein an internal capacitance of the second transistor is smaller than an internal capacitance of the first transistor.

7. The light emitting module according to claim 1, wherein the sensing wire is fixed to the surface of the conversion member.

8. The light emitting module according to claim 7, wherein the sensing wire is formed with a light transmissive conductive material.

9. A light emitting module comprising:
a laser element to emit a laser beam;
a first n-channel transistor comprising:
a drain;
a source, one of the source and the drain being connected to the laser element, another of the source or the drain being connected to a power supply; and
a gate;
a second n-channel transistor comprising:
a drain connected to a sensing potential;
a source connected to a common potential lower than the sensing potential via a first resistor, the gate of the first transistor being connected to the source of the second n-channel transistor and the first resistor; and
a gate;
a conversion member to convert the laser beam into a light having a wavelength different from a wavelength of the laser beam, the conversion member comprising:

a sensing wire via which the gate of the second transistor is connected to the sensing potential, the gate of the second transistor being connected to the common potential via a second resistor;

the first n-channel transistor being configured to be turned on when the sensing potential is applied to the control electrode of the first n-channel transistor;

the first n-channel transistor being configured to be turned off when the common potential is applied to the control electrode of the first n-channel transistor;

the second n-channel transistor being configured to be turned on when the sensing potential is applied to the control electrode of the second n-channel transistor; and the second n-channel transistor being configured to be turned off when the common potential is applied to the control electrode of the second n-channel transistor.

10. The light emitting module according to claim 9, wherein a resistance value of the first resistor is lower than a resistance value of the second resistor.

11. The light emitting module according to claim 9, wherein an internal capacitance of the second transistor is smaller than an internal capacitance of the first transistor.

12. The light emitting module according to claim 9, wherein the sensing wire is fixed to the surface of the conversion member.

13. The light emitting module according to claim 12, wherein the sensing wire is formed with a light transmissive conductive material.

14. A light emitting module comprising:

a laser element to emit a laser beam;

a conversion member to convert the laser beam into a light having a different wavelength from a wavelength of the laser beam;

a first transistor serially connected to the laser element;

a second transistor;

a first resistor serially connected to the second transistor at a first connection node that is connected to a control node of the first transistor;

a sensing wire provided on the conversion member; and a second resistor serially connected to the sensing wire at a second connection node that is connected to a control electrode of the second transistor.

15. The light emitting module according to claim 14, wherein a resistance value of the first resistor is lower than a resistance value of the second resistor.

16. The light emitting module according to claim 14, wherein an internal capacitance of the second transistor is smaller than an internal capacitance of the first transistor.

17. The light emitting module according to claim 14, wherein the sensing wire is fixed to the surface of the conversion member.

18. The light emitting module according to claim 17, wherein the sensing wire is formed with a light transmissive conductive material.

* * * * *